(12) United States Patent
Wronski et al.

(10) Patent No.: US 8,253,212 B2
(45) Date of Patent: Aug. 28, 2012

(54) PHOTODETECTOR/IMAGING DEVICE WITH AVALANCHE GAIN

(75) Inventors: Matthew M. Wronski, Toronto (CA); Giovanni DeCrescenzo, Toronto (CA); Alla Reznik, Toronto (CA); Wei Zhao, Stony Brook, NY (US); Jennifer Ann Segui, Stony Brook, NY (US); John A. Rowlands, Toronto (CA)

(73) Assignees: Sunnybrook Health Sciences Centre, Toronto, Ontario (CA); Research Foundation of State University of New York, Stony Brook, NY (US)

( * ) Notice: Subject to any disclaimer, the term of this patent is extended or adjusted under 35 U.S.C. 154(b) by 213 days.

(21) Appl. No.: 12/457,855

(22) Filed: Jun. 23, 2009

(65) Prior Publication Data

US 2010/0181487 A1    Jul. 22, 2010

Related U.S. Application Data

(60) Provisional application No. 61/129,389, filed on Jun. 23, 2008.

(51) Int. Cl.
*H01L 31/107* (2006.01)
(52) U.S. Cl. ............ 257/438; 250/214 A; 250/214.1; 257/E31.063

(58) Field of Classification Search ............ 250/214 A, 250/214.1, 214 R; 257/59, 225, 438, E31.032, 257/E31.073, E31.063
See application file for complete search history.

(56) References Cited

U.S. PATENT DOCUMENTS

| | | | |
|---|---|---|---|
| 5,457,327 A * | 10/1995 | Taguchi | 257/21 |
| 5,539,221 A * | 7/1996 | Tsuji et al. | 257/186 |
| 5,942,788 A * | 8/1999 | Takada et al. | 257/438 |
| 7,301,135 B2 * | 11/2007 | Shoji | 250/214.1 |
| 7,373,091 B2 * | 5/2008 | Moeller | 398/204 |
| 7,460,189 B2 * | 12/2008 | Ishigaki et al. | 349/42 |
| 7,994,601 B2 * | 8/2011 | Nakata | 257/438 |
| 2002/0175271 A1 * | 11/2002 | Shoji | 250/214.1 |
| 2004/0245592 A1 * | 12/2004 | Harmon et al. | 257/438 |
| 2005/0211879 A1 * | 9/2005 | Iwakiri | 250/214.1 |
| 2006/0001118 A1 * | 1/2006 | Boisvert et al. | 257/438 |
| 2009/0039237 A1 * | 2/2009 | Inoue et al. | 250/214 R |

* cited by examiner

*Primary Examiner* — Allan R Wilson
(74) *Attorney, Agent, or Firm* — Harness, Dickey & Pierce, P.L.C.

(57) ABSTRACT

A photodetector/imaging device comprises a layer of photoconductive material converting incident electromagnetic radiation into electrical charges, the layer of photoconductive material being capable of avalanche multiplication when an electric field of sufficient magnitude is applied thereacross; a readout layer detecting the electrical charge; and at least one interface layer between the layer of photoconductive material and the readout layer, the interface layer coupling electrical charge to or from the layer of photoconductive material and being configured to inhibit uncontrolled rises in current in the photoconductive material during avalanche multiplication.

62 Claims, 6 Drawing Sheets

PHOTODETECTOR/IMAGING DEVICE WITH AVALANCHE GAIN

CROSS-REFERENCE TO RELATED APPLICATION

This application claims the benefit of U.S. Provisional Application No. 61/129,389 to Wronski et al. filed on Jun. 23, 2008 entitled "Photodetector/Imaging Device with Avalanche Gain", the contents of which are incorporated herein by reference.

FIELD OF THE INVENTION

The present invention relates generally to photon detection and imaging devices and in particular, to a photodetector/imaging device with avalanche gain.

BACKGROUND OF THE INVENTION

Chalcogenide glasses belong to a class of materials that exhibit a number of interesting electrical and optical properties. Amorphous selenium (a-Se), for instance, is a particularly prominent type of chalcogenide glass. It has photonconductive properties and has been used in a variety of devices including for example, photocopiers, medical imaging systems and high-definition television broadcasting cameras.

Photoconductors are materials that are sensitive to visible light and other types of electromagnetic radiation (i.e. x-rays, ultraviolet radiation, infrared radiation etc.). When photons strike a photoconductor, they produce, through the process of ionization, two types of electric charge known as electrons and holes. Subjecting the photoconductor to an electric field while photons strike the photoconductor results in the holes and electrons flowing freely through the photoconductive material in opposite directions along the orientation of the electric field. Measuring the number of holes or electrons generated in the photoconductive material yields a resulting electric signal that has a magnitude directly related to the number of photons striking a particular region of the photoconductive material.

Amorphous photoconductors have an important advantage over conventional crystalline photoconductors (e.g. silicon) in that they can be easily manufactured over large areas by employing thermal evaporation, sputtering and vapour deposition processes.

In most cases, amorphous chalcogenide photoconductors (ACPs) are biased at relatively low electric fields (e.g. 10 V/µm for a-Se). At much higher electric fields (e.g. 80 V/µm and larger for a-Se), multiplication of charge carriers occurs. This property of multiplication of charge carriers, known as avalanche multiplication, is an important feature of certain ACPs such as a-Se, and has been utilized in a television camera that is more sensitive than the human eye as described in the publication entitled "Ultrahigh-sensitivity HDTV new Super-HARP camera" authored by K. Miyakawa et al. and published in Proc. SPIE 5677, 26-34, 2005.

The key limitation to utilizing the avalanche properties of ACPs in solid-state devices for very high sensitivity applications such as medical imaging has to do with the high electric fields required to precipitate hole and electron avalanche. Every so often when an ACP is biased with an electric field, electrical discharges occur in the biased ACP. At the high electric fields required for avalanche multiplication, these electrical discharges produce an electric current that rises uncontrollably. This effect, referred to as incipient breakdown, has the unfortunate consequence of irreversibly altering the structure of the photoconductive material of the ACP. Specifically, the high electric current at incipient breakdown heats up the ACP to the point where the photoconductive material of the ACP crystallizes.

To-date, avalanche multiplication in ACPs has only been used successfully in vacuum tube devices in which the surface of the ACP is scanned by an electron beam as described in the above-identified Miyakawa et al. publication. These vacuum tube devices, which are based on a-Se, derive their gain solely from the multiplication of a single charge carrier type (holes), as they are unable to support the higher electric fields at which the second charge carrier type (electrons) avalanches. The highest gain achieved to-date in these vacuum tube devices is approximately 1000.

There are two primary avalanche regions of operation in most solid-state avalanche photoconductors, namely the linear region and the Geiger region. In the linear region, only one type of charge carrier (holes) avalanches and the multiplication gain is simply proportional to the initial number of photogenerated charges. In the Geiger region, both charge carriers (i.e. holes and electrons) avalanche. When a charge carrier undergoes impact ionization, which is the underlying process behind avalanche multiplication, the charge carrier produces two new carriers of opposite charge. The newly-generated hole and electron are drawn towards opposite sides of the ACP, in turn producing more impact ionization events. This chain reaction can rapidly grow without bounds and eventually causes the electric field inside the ACP to collapse. In this case, the mode of operation of the ACP is highly nonlinear since any number of initially photogenerated carriers produces the same effect.

Known prior art discloses the use of amorphous selenium (a-Se) in high sensitivity solid-state photodetectors and imagers. For example, U.S. Pat. No. 5,818,052 to Elabd discloses a broad band solid state image sensor responsive up to and beyond the 1 µm cutoff wavelength, for use in a camera capable of imaging under very low light level conditions with good modulation transfer efficiency resulting in high resolution. The image sensor, which achieves high sensitivity at low light level, comprises a photoconductor with high avalanche detection gain, a silicon detector with very high gain pixel level amplifiers and noise suppression circuits. In particular, a high gain avalanche rushing photoconductor (HARP) sensor device is connected to an amplified metal-oxide silicon (AMOS) device and a low-noise read-out device. The high sensitivity image sensor device is fabricated by depositing an amorphous selenium photoconductive layer on top of a silicon junction diode or a palladium silicide (Pd2Si) Schottky barrier diode that is connected to the AMOS pixel amplifier circuits to form a two story AMOS device.

U.S. Pat. No. 5,892,222 to Elabd discloses a low light level detection and imaging device including a photon sensing and counting device for image detection that is capable of detecting/imaging low photon flux levels over a wide spectral range using either image tube or solid state readout. The photon sensing and counting device is composed of a detector stack having several photoconductive layers, at least one layer of the stack being an amorphous selenium layer that is capable of high gain avalanche multiplication. The detector stack further includes an amorphous silicon layer deposited on the amorphous selenium layer to absorb infrared (IR) and ultraviolet radiation to enhance responsivity in the red and near-IR region. The purpose of the amorphous selenium layer is to provide high responsivity in the blue region and also to provide avalanche gain or multiplication of the photo generated carriers in the amorphous silicon or selenium layers.

U.S. Patent Application Publication No. 2001/0020690 to Yasuda et al. discloses an image recording sheet and a solid-state image detector. The image recording sheet has a stimulable phosphor layer laminated on a base, and the solid-state image detector includes a photoconductive layer containing amorphous selenium as its main component and electrodes disposed on opposite sides of the photoconductive layer. An electric field is applied across the photoconductive layer so that avalanche amplification is obtained within the photoconductive layer. The image recording sheet is scanned under the electric field with stimulating light of wavelength of about 600 nm. Photostimulated luminescence light of wavelength of about 400 nm emitted from the fluorescent layer is incident on the photoconductive layer via an optical guide and a stimulating light cut filter. Electric charge generated within the photoconductive layer is detected by a current detecting circuit, whereby a radiation image signal is obtained.

International PCT Application No. WO 2005/103762 to Lee discloses a flat panel imager that generates an electronic x-ray image though direct conversion of x-ray energy to electrical charges in a selenium-based layer at first electrical fields of the order of 10 volts per micrometer established therein between upper and lower electrodes. At least one electrically conductive grid extends generally laterally at a level above but close to a lower surface of the selenium-based layer, and is biased to establish higher electrical fields in portions of the selenium-based layer below the grid in the order of at least 75 volts per micrometer thereby to promote an avalanche effect in the high-field portion of the selenium-based layer.

Although the above-references show solid-state photodetector/imaging devices employing amorphous selenium that take advantage of avalanche multiplication, to-date none of these solid-state photodetector/imaging devices have been commercialized, primarily because of the limitation associated with incipient breakdown at high electric fields (i.e. fields greater than 10 V/um in a-Se). Furthermore, these solid-state photodetector/imaging devices only take advantage of avalanche multiplication of a single type of charge carrier (holes). This is because the two types of charge carriers have different mobilities and, as such, for both charge carrier types (holes and electrons) to avalanche, a higher electric field (i.e. 110 V/um in a-Se) is required than for a single charge carrier to avalanche. As mentioned above, the need to apply a higher electric field further compounds the incipient breakdown problem since the amount of energy stored across the photoconductor grows quadratically as a function of the bias potential.

As will be appreciated, improvements in photodetector/imaging devices that take advantage of avalanche multiplication are desired. It is therefore an object of the present invention to provide a novel photodetector/imaging device with avalanche gain.

SUMMARY OF THE INVENTION

Accordingly, in one aspect there is provided a photodetector/imaging device comprising a layer of photoconductive material converting incident electromagnetic radiation into electrical charges, the layer of photoconductive material being capable of avalanche multiplication when an electric field of sufficient magnitude is applied thereacross; a readout layer detecting the electrical charge; and at least one interface layer between the layer of photoconductive material and the readout layer, the interface layer coupling electrical charge to or from the layer of photoconductive material and being configured to inhibit uncontrolled rises in current in the photoconductive material during avalanche multiplication.

In one embodiment, the resistivity of the at least one interface layer is significantly less than the resisitivity of the layer of photoconductive material. The at least one interface layer restricts current flow at discharge regions in the layer of photoconductive material that occur during avalanche multiplication. The at least one interface layer is configured to inhibit diffusion of the at least one interface layer into the layer of photoconductive material. The at least one interface is also configured to limit imaging artifacts.

In one embodiment, the layer of photoconductive material is an amorphous chalcogenide photoconductor. The readout layer comprises an array of thin film transistors coupled to an array of pixel electrodes. The at least one interface layer is configured to limit the magnitude of electric fields near sharp edges of the pixel electrodes and to planarize the surface of the readout layer adjacent the at least one interface layer. The at least one interface layer may be formed of a polymer or an inorganic material.

In another embodiment, the at least one interface layer comprises first and second interface layers. The first interface layer inhibits uncontrolled rises in current in the layer of photoconductive material during avalanche multiplication and the second interface layer provides a generally planar surface for the readout layer.

According to another aspect there is provided a photodetector/imaging device comprising an electrode generally transparent to incident electromagnetic radiation; a layer of photoconductive material converting electromagnetic radiation passing through the electrode into electrical charge, the layer of photoconductive material undergoing avalanche multiplication when an electric field of sufficient magnitude is applied thereacross; a readout layer detecting electrical charges developed in the layer of photoconductive material; and at least one semi-insulating interface layer between the layer of photoconductive material and the readout layer, the interface layer restricting electrical current flow through discharge regions in the layer of photoconductive material that occur during avalanche multiplication.

According to yet another aspect there is provided a detector/imager comprising an electrode generally transparent to incident electromagnetic radiation; an amorphous chalcogenide photoconductive layer converting electromagnetic radiation passing through the electrode into electrical charge, the photoconductive layer having an avalanche gain that is a function of an electric field applied thereacross; a readout layer detecting electrical charge developed by the layer of photoconductive material; and at least one semi-insulating interface layer between the layer of photoconductive material and the readout layer, said at least one interface layer being configured to inhibit incipient breakdown in the photoconductive layer.

BRIEF DESCRIPTION OF THE DRAWINGS

Embodiments will now be described more fully with reference to the accompanying drawings in which.

DETAILED DESCRIPTION OF THE EMBODIMENTS

In the following, a photodetector/imaging device with avalanche gain is disclosed that avoids the undesirable effects associated with incipient breakdown allowing the photodetector/imaging device to be subjected to high electric fields sufficient to take advantage of avalanche multiplication of both types of charge carriers (holes and electrons). In one form, the photodetector/imaging device comprises a layer of photoconductive material for receiving incident electromagnetic radiation and for converting the electromagnetic radiation into electrical charges. The layer of photoconductive material is capable of avalanche multiplication when an electric field of sufficient magnitude is applied thereacross. At least one interface layer is provided for coupling electric charge to or from the layer of photoconductive material. A readout layer detects the electrical charge.

Figure 1:
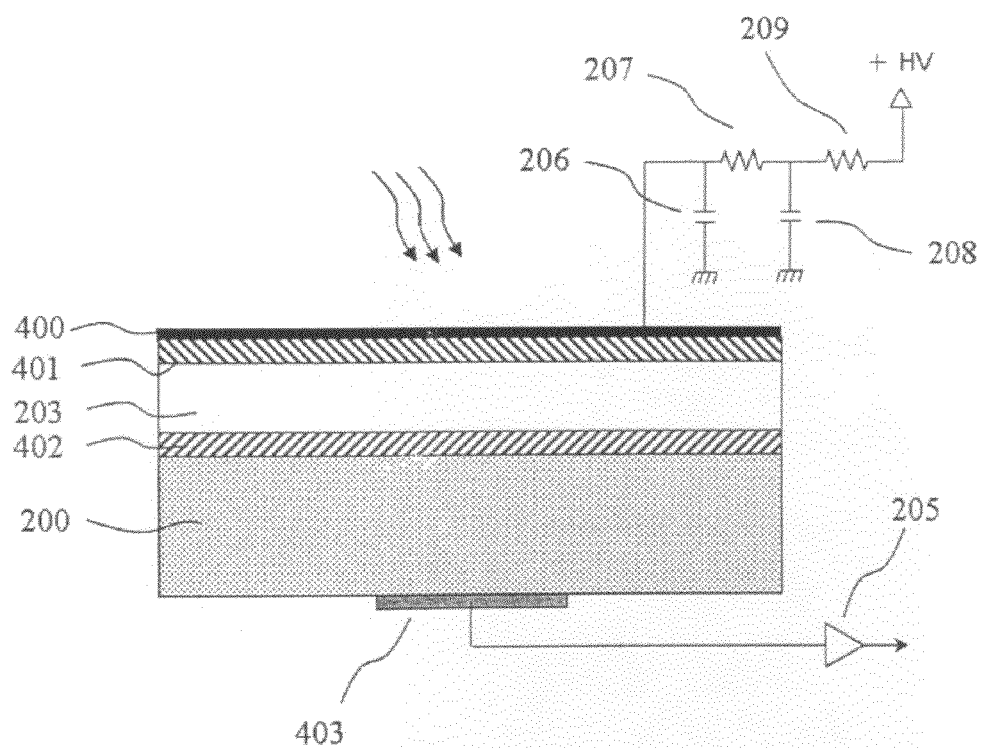
FIG. 1 is a cross-sectional illustration of an experimental photodetector device with avalanche gain.

For proof of concept, an experimental photodetector device with avalanche gain was developed as shown in FIG. 1. As can be seen, the photodetector device comprises a thick layer of photoconductive material 203 sandwiched between a hole blocking contact layer 401 and an electron blocking contact layer 402. In this structure, the thick layer of photoconductive material 203 is a 15 μm thick layer of amorphous selenium (a-Se). The hole blocking contact layer 401 is formed of cerium dioxide and the electron blocking contact layer 402 is formed of antimony trisulfide or arsenic triselenide. An electrode 400 formed of indium tin oxide overlies the hole blocking contact layer 401. A semi-insulating polymer interface layer 200 underlies the electron blocking contact layer 402. In this structure, the semi-insulating polymer interface layer 200 is a 5 μm thick layer of cellulose acetate. A readout layer 403 in the form of a PEDOT electrode is positioned on the bottom surface of the semi-insulating polymer interface layer 200. An amplifier stage 205 is electrically coupled to the electrode 403.

An external circuit in electrical contact with the electrode 400 couples the photodetector device to a high voltage source HV that provides a bias to the photodetector device in the range of from about 0 to about 2000V. This allows the photodetector device to be subjected to an electric field of magnitude sufficient to promote avalanche multiplication of both types of charge carriers (holes and electrons). The external circuit comprises a signal coupling capacitor 206, a low pass filter formed by a resistor 209 and a capacitor 208, and a current limiting resistor 207. The photodetector device is optically excited using an electromagnetic radiation source in the form of a pulsed nitrogen laser (not shown).

When the photodetector device is biased by an electric field of magnitude sufficient to promote avalanche multiplication and is subjected to incident light photons output by the pulsed nitrogen laser, the light photons travel through the transparent electrode 400 and the cerium dioxide hole blocking contact layer 401 and are absorbed in the photoconductive material layer 203. Photo-generated holes in the photoconductive material layer 203 undergo avalanche multiplication gain, travel through the electron blocking contact layer 402 and the semi-insulating polymer interface layer 200 and are collected by the electrode 403. The resulting charges are read out by the amplifier stage 205.

The photodetector device is configured to inhibit structural transformation and in particular crystallization of the a-Se photoconductive material layer 203 resulting from incipient breakdown by coating the photoconductive material layer with the semi-insulating polymer interface layer 200. As mentioned above, incipient breakdown usually starts in a small (several square microns) region of the photoconductive material in which an electrical discharge occurs. If the electrical current that flows through this discharge region reaches a certain level, it will generate enough heat to crystallize the photoconductive material. The uncontrollable rise of electrical current eventually leads to heat diffusing laterally, which crystallizes surrounding photoconductive material, leading to an irreversible and undesirable structural transformation of the photoconductive material.

By coating the a-Se photoconductive material layer 203 with the semi-insulating polymer interface layer 200, a two-layer structure results that restricts the amount of electrical current that flows through any discharge region thereby preventing the heating and associated crystallizing of the photoconductive material. As a result, the occurrence of incipient breakdown is avoided. The resistivity $\rho_{IL}$ of the semi-insulating polymer interface layer 200 is selected so that it is much lower than the resistivity $\rho_P$ of the photoconductive material layer 203 to ensure that most of the bias voltage applied to the photodetector device drops across the photoconductive material layer 203, thus producing the high electric field necessary for avalanche multiplication as expressed by:

$$\rho_{IL} \ll \rho_P \qquad [1]$$

Figure 2:
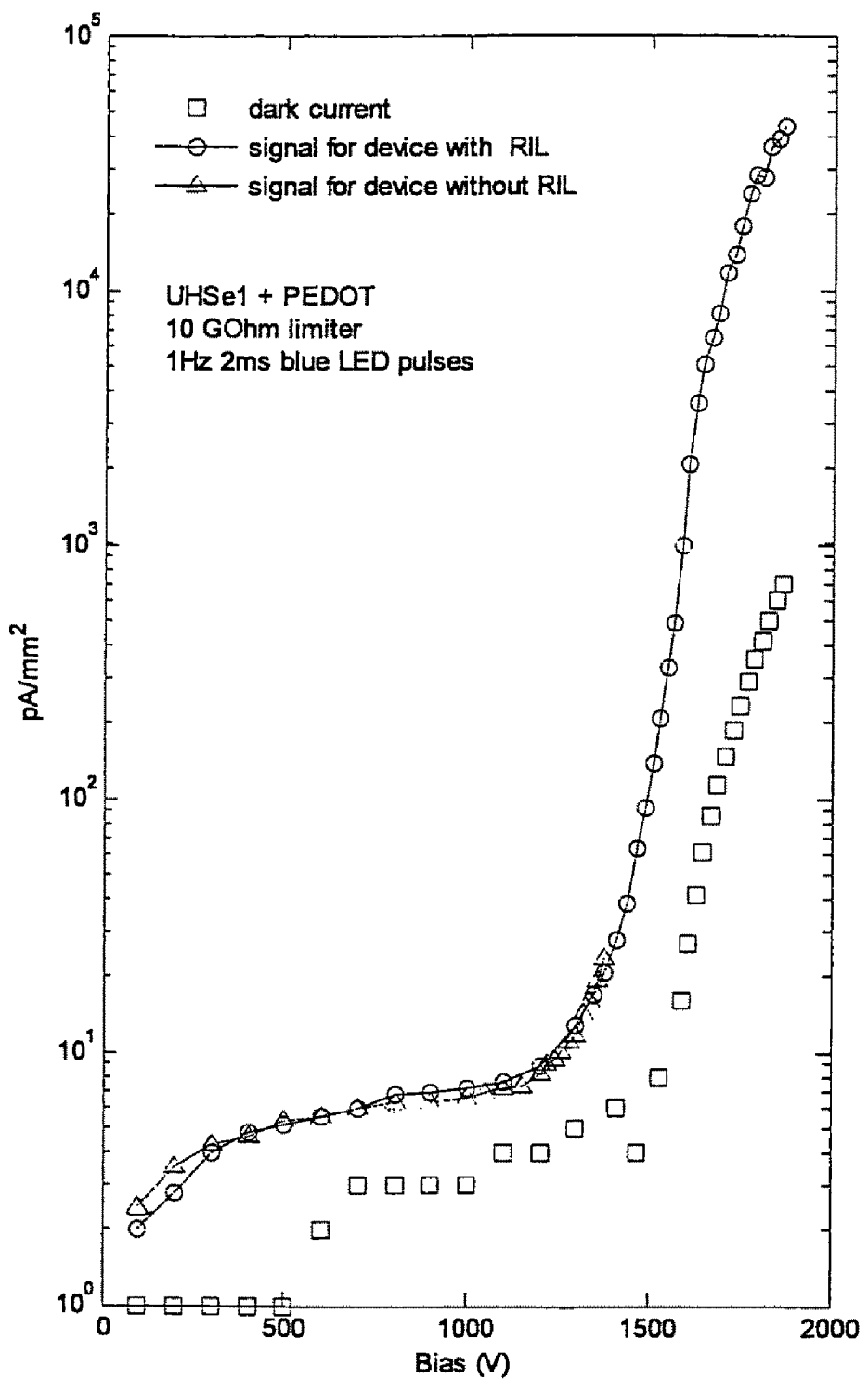
FIG. 2 shows plots of signal magnitudes measured experimentally for the photodetector device of FIG. 1 with and without an interface layer.

Experimental measurement results are shown in FIG. 2 for the photodetector device with and without the semi-insulating polymer interface layer 200. The experimental measurements reveal the functional role of the semi-insulating polymer interface layer 200, and indicate in particular that the semi-insulating polymer interface layer 200 effectively enables operation of the photodetector device at very high avalanche gains, without any adverse effects to the photoconductive material layer 203. The experimental measurement results were found to be reproducible and confirm that the contact between the semi-insulating polymer interface layer 200 and the photoconductive material layer 203 including the hole and electron blocking contact layers 401 and 402 is stable and does not degrade over time. From the experimental measurement results, a number of findings are apparent.

Despite the relatively low dielectric strength of the semi-insulating polymer interface layer 200 (10 V/μm), the formation of a sudden conduction path (arc) in the photoconductive material layer 203 during an electrical discharge does not stress the semi-insulating polymer interface layer 200 to the point of breaking it down. The presence of the semi-insulating polymer interface layer 200 substantially eliminates sporadic electrical discharges at low to high electric fields (0-90 V/μm). The semi-insulating polymer interface layer 200 restricts the amount of energy dissipated in the photoconductive material layer 203 by incipient breakdown events and thus enables the application of very high electric fields (120 V/μm or more) without crystallization of the photoconductive material layer 203 occurring. Stable operation at very high electric fields can be been sustained for extended periods of time (i.e. 3 hours). The solid-state structure of the photodetector device enables much higher avalanche gains than are currently achievable with similar "free surface" photoconductive material layers scanned by an electron beam inside a vacuum tube as described in the above-identified Miyakawa et al. publication. An avalanche gain as high as 10,000 was measured which compares favorably with a gain of 1,000 obtained using a vacuum tube analogue. Despite the resistance of the semi-insulating polymer interface layer 200, the temporal response of the two-layer photoconductive material layer/semi-insulating polymer interface layer structure is not significantly degraded. Millisecond pulses of electromagnetic radiation can be applied at tens of Hz and nanosecond pulses of electromagnetic radiation are almost entirely capacitively coupled through the semi-insulating polymer interface layer 200.

Dielectric breakdown is a complex phenomenon, particularly in multi-layered structures. The above findings provide a high degree of assurance that the photoconductor device structure is robust and avoids the undesirable effects associated with incipient breakdown. The photoconductor device structure can be biased at electric fields exceeding 100 V/µm, allowing avalanche multiplication of both holes and electrons to take place. This effectively increases the gain in the linear region of operation and also enables Geiger region operation. In the Geiger region, the semi-insulating polymer interface layer 200 additionally serves to quench the avalanche breakdown and reset the photodetector device after a photon interaction occurs.

As will be appreciated by those of skill in the art, the structure of the photoconductor device described above has applications in wide dynamic range and high sensitivity imaging devices. For example, turning now to FIG. 3, an imaging device with avalanche gain that makes use of the photoconductor device structure described above is shown. As can be seen, the imaging device comprises a thick layer of photoconductive material 203 sandwiched between a transparent conductive electrode 204 and a semi-insulating polymer interface layer 200. Similar to the previous embodiment, the thick layer of photoconductive material is a layer of a-Se and the semi-insulating polymer interface layer 200 is a layer of cellulose acetate. A charge readout layer 202 comprising a thin film transistor (TFT) array electrically coupled to an array of pixel electrodes 201 underlies the semi-insulating polymer interface layer 200. An amplifier stage 205 is coupled to the charge readout layer 202.

An external circuit is in electrical contact with the electrode 204 and couples the imaging device to a high voltage source HV that provides a bias to the imaging device in the range of from about 0 to about 2000V. This allows the imaging device to be subjected to an electric field of a magnitude sufficient to promote avalanche multiplication of both types of charge carriers (holes and electrons). The external circuit is similar to that shown in FIG. 1 and comprises a signal coupling capacitor 206, a low pass filter formed by a resistor 209 and a capacitor 208, and a current limiting resistor 207.

During operation, when the imaging device is biased by an electric field of a sufficient magnitude to promote avalanche multiplication and is subjected to incident light photons output by an electromagnetic radiation source, the light photons travel through the transparent conductive electrode 204 and are absorbed in the photoconductive material layer 203. Photo-generated holes in the photoconductive material layer 203 undergo avalanche multiplication gain, travel through the semi-insulating polymer interface layer 200 and are collected by the array of pixel electrodes 201. The resulting charges on the pixel electrodes 201 are read out by the amplifier stage 205 via the thin film transistors of the charge readout layer 202 and subsequently processed to yield a digital image.

The semi-insulating polymer interface layer 200 serves an important function for bonding and transferring charge between the photoconductive material layer 203 and the charge readout layer 202. First, the semi-insulating polymer interface layer 200 provides a chemically stable contact to the photoconductive material whose properties (i.e. microstructure) do not change over time. Unlike sputtered or thermally evaporated metallization layers which are prone to diffusion through the amorphous photoconductive material, the polymer material of the semi-insulating interface layer 200 comprises large cross-linked molecular chains that cannot diffuse into the photoconductive material.

Secondly, the semi-insulating polymer interface layer 200 serves as a bonding or adhesion layer between the photoconductive material layer 203 and the charge readout layer 202. In particular, the semi-insulating polymer interface layer 200 provides a mechanically stable contact between the photoconductive material layer 203 and the charge readout layer 202 that is sufficiently robust for adequate bonding and adhesion over areas greater than several square centimeters, which is particularly important for large area imaging devices.

Thirdly, as the semi-insulating polymer interface layer 200 is in direct electrical contact with the sensitive electronics (i.e. electrically connected to the pixel electrodes 201) of the charge readout layer 202, the semi-insulating polymer interface layer 200 is chosen to have sufficient lateral conduction to limit the occurrence of high electric fields near sharp edges of the pixel electrodes 201. The desired conductivity and thickness of the semi-insulating polymer interface layer 200 is dependent on the strength of the applied electric field, the amount of charge generated per unit area, and the pixel electrode size, all of which are application-dependent.

As will be appreciated, the above imaging device provides a practical means for holes and electrons to avalanche in an amorphous photoconductive material. The design of the imaging device is chosen to reduce potential imaging artifacts. One such imaging artifact is due to gain non-uniformities, which can have two possible causes: (1) variable electric field strength enhancement near pixel electrode edges; and (2) variable thickness of the photoconductive material 203 layer due to a variable surface topography of the charge readout layer 202. In both cases, the associated variations in electric field strength produce gain non-uniformities. Furthermore, because avalanche gain is very strongly dependent on the electric field strength, even minute non-uniformities in electric field can lead to gain non-uniformities that are beyond reach of conventional post-processing gain correction algorithms.

The semi-insulating polymer interface layer 200 is designed to limit such non-uniformities by: (1) having sufficient lateral conduction to eliminate any appreciable electric field enhancement near edges of the pixel electrodes 201, but not enough lateral conduction to cause current leakage between neighboring pixel electrodes 201; and (2) by using a semi-insulating polymer interface layer material and a deposition process that enables the surface of the charge readout layer 202 to be planarized. The first requirement imposes the following criterion for the semi-insulating polymer interface layer 200:

$$d_{IL} \ll \frac{l \cdot p}{t} \qquad [2]$$

where $d_{IL}$ is the thickness of the semi-insulating polymer interface layer 200, l is the pixel electrode size, p is the spacing between pixel electrodes 201 and t is the thickness of the conductive material that constitutes the pixel electrodes 201.

To address the second requirement, a semi-insulating polymer interface layer material and deposition process are used that enable planarization as will now be described. The semi-insulating polymer interface layer is spin coated to evenly cover the surface of the charge readout layer 202 with either one or more coats as necessary to achieve the required degree of planarization. Polymer nanocomposites are used as they allow for the resistivity of the semi-insulating polymer interface layer to be customized in accordance with criterium [1] and as required by the particular application. The nanocomposite is formed using an insulating polymer matrix for planarizing structures in electronic applications with high-aspect ratio (i.e. benzocyclobutene). Nanocomposites are developed with conductive filler nanoparticles or with doped conductive polymers as they can be evenly dispersed and variably doped to achieve control of resistivity in semiconducting and insulating ranges with adequate reproducibility. At nanoscale diameters, small loading fractions are required in order to preserve the ability of the insulating polymer to planarize.

Another imaging artifact that is controlled through the proper selection of the semi-insulating polymer interface layer 200 is aliasing of the noise power spectrum of the image. Each stage of the imaging device contributes some degree of noise to the final image. Because the charge representation of the image is sampled using pixel electrodes 201 having a finite size and period, the image noise power spectrum is aliased with respect to the Nyquist frequency. This aliasing mostly affects the higher spatial frequencies. The noise aliasing can be reduced by using a semi-insulating polymer interface layer 200 that "blurs" the charge distribution and thus effectively serves as a low-pass noise filter.

Figure 4:
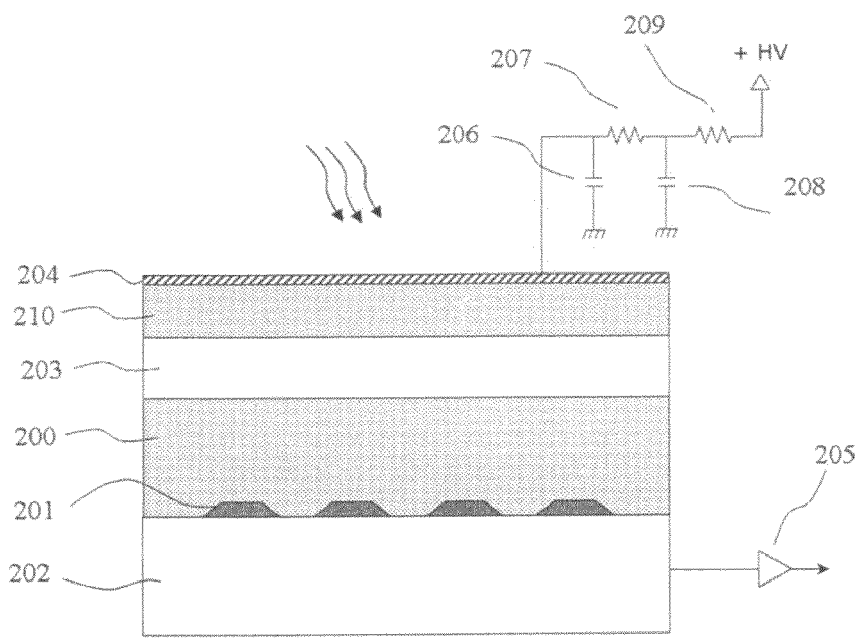
FIG. 4 is a cross-sectional illustration of an alternative imaging device with avalanche gain.

Although the imaging device described above comprises a single layer of semi-insulating material, alternatives are available. For example, the imaging device may comprise two semi-insulating polymer interface layers 200 and 210 that sandwich the photoconductive material layer 203 as shown in FIG. 4. As can be seen, semi-insulating polymer interface layer 200 is located above the charge readout layer 202 of the imaging device and is configured to protect the readout electronics while providing a sufficient amount of pre-sampling blurring. The semi-insulating polymer interface layer 210 is located above the photoconductive material layer 203 and is configured to further help inhibit incipient breakdown in the photoconductive material layer 203.

Figure 5:
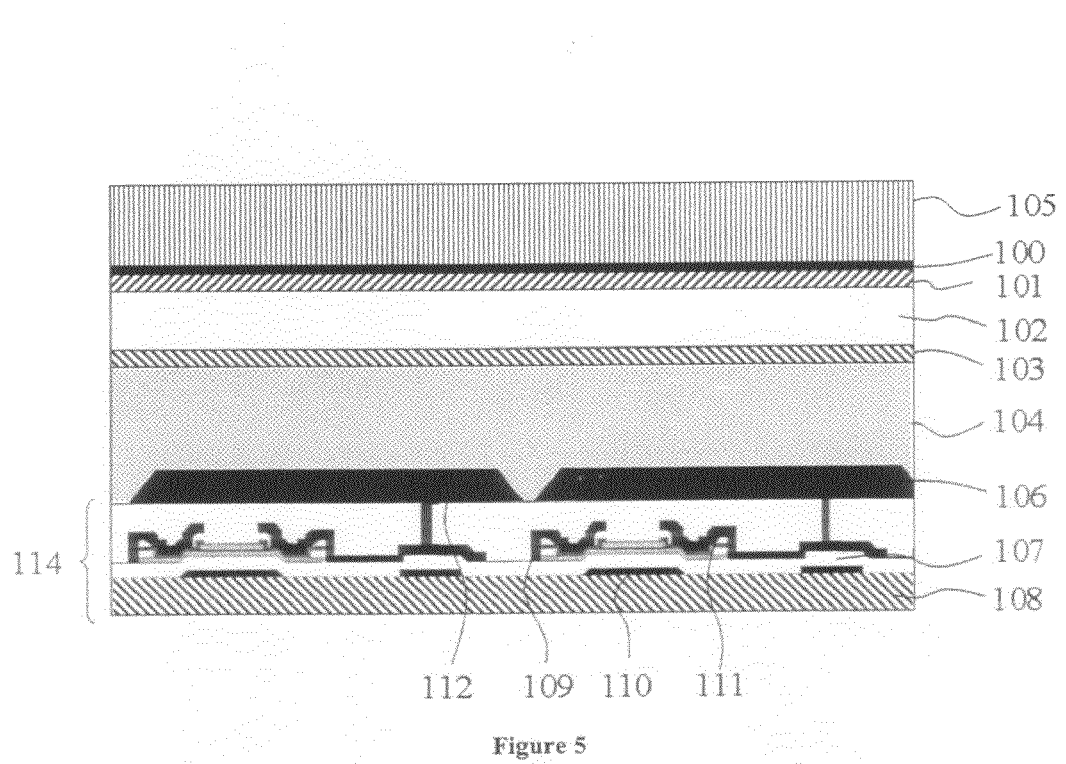
FIG. 5 is a cross-sectional illustration of a flat-panel x-ray detector with avalanche gain.

Turning now to FIG. 5, a flat-panel detector with avalanche gain for imaging x-rays that makes use of the photoconductor device structure of FIG. 1 is shown. As can be seen, the flat panel detector comprises a thick layer of photoconductive material 102 sandwiched between a cerium dioxide hole blocking contact layer 101 and an antimony trisulfide electron blocking contact layer 103. A transparent indium tin oxide electrode 100 overlies the blocking contact layer 101. A cesium iodide scintillator or phosphor layer 105 overlies the electrode 100. A semi-insulating polymer interface layer 104 underlies the blocking contact layer 103. Similar to the previous embodiments, the thick layer of photoconductive material is a layer of a-Se and the semi-insulating polymer interface layer 104 is a layer of cellulose acetate. A charge readout layer 114 is positioned beneath the semi-insulating polymer interface layer 104 and is disposed on a glass substrate 108. In this embodiment, the charge readout layer comprises pixel electrodes 106, each of which is electrically coupled to a respective pixel storage capacitor 107. A thin film transistor comprising a gate 110, a source 109 and a drain 111 is electrically coupled to each pixel storage capacitor 107. An external circuit similar to that described above with reference to FIGS. 1 and 3 is electrically coupled to the electrode 100 to provide the appropriate bias to the flat panel detector.

During operation, when the flat panel detector is biased by an electric field of magnitude sufficient to promote avalanche multiplication and is subjected to incident x-rays output by an electromagnetic radiation source, the scintillator 105 converts the incident x-rays into light photons that travel through the transparent indium tin oxide electrode 100 and the cerium dioxide hole blocking contact 101 and are absorbed in the photoconductive material layer 102. Photo-generated holes in the photoconductive material layer undergo avalanche multiplication gain, travel through the electron blocking contact 103 and the semi-insulating polymer interface layer 104 and are collected by the pixel electrodes 106. The holes collected by each pixel electrode 106 are in turn stored on the associated pixel storage capacitor 107. The thin film transistors are used to read out the collected charges from the pixel storage capacitors 107 and the read charges are subsequently processed to yield a digital image.

Figure 6:
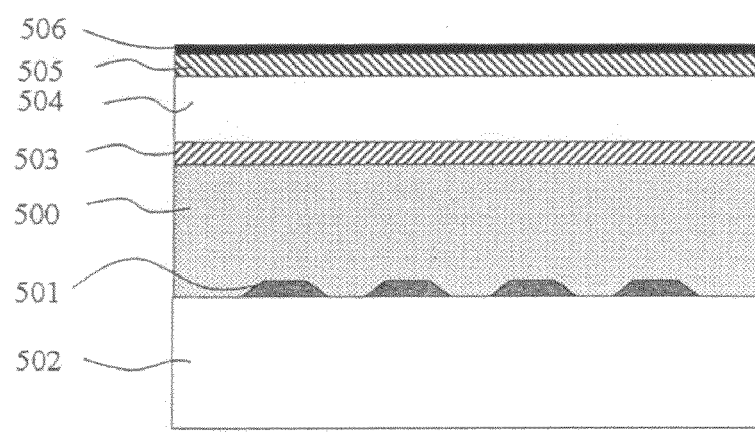
FIG. 6 is a cross-sectional illustration of an optical detector with avalanche gain.

Turning now to FIG. 6, an optical detector with avalanche gain that makes use of the photoconductive device structure of FIG. 1 is shown. As can be seen, the optical detector comprises a thick layer of photoconductive material 504 sandwiched between a cerium dioxide hole blocking contact layer 505 and an antimony trisulfide electron blocking contact layer 503. A transparent indium tin oxide electrode 506 overlies the blocking contact layer 505. A semi-insulating polymer interface layer 500 underlies the blocking contact layer 503. Similar to the previous embodiments, the thick layer of photoconductive material is a layer of a-Se and the semi-insulating polymer interface layer is a layer of cellulose acetate. An array of pixel electrodes 501 is positioned beneath the semi-insulating polymer interface layer 500 and is disposed on a charged-coupled device 502. An external circuit similar to that described above with reference to FIGS. 1 and 3 is electrically coupled to the electrode 506 to provide the appropriate bias to the optical detector.

During operation, when the optical detector is biased by an electric field of magnitude sufficient to promote avalanche multiplication and is subjected to incident light photons output by an electromagnetic radiation source, the incident light photons travel through the transparent indium tin oxide electrode 506 and the cerium dioxide hole blocking contact 505 and are absorbed in the photoconductive material layer 504. Photo-generated holes in the photoconductive material layer undergo avalanche multiplication gain, travel through the electron blocking contact 503 and the semi-insulating polymer interface layer 500 and are collected by the pixel electrodes 501. The resulting charges collected on the pixel electrodes are in turn read out by the charge-coupled device 502 and are subsequently processed to yield a digital image.

Figure 7:
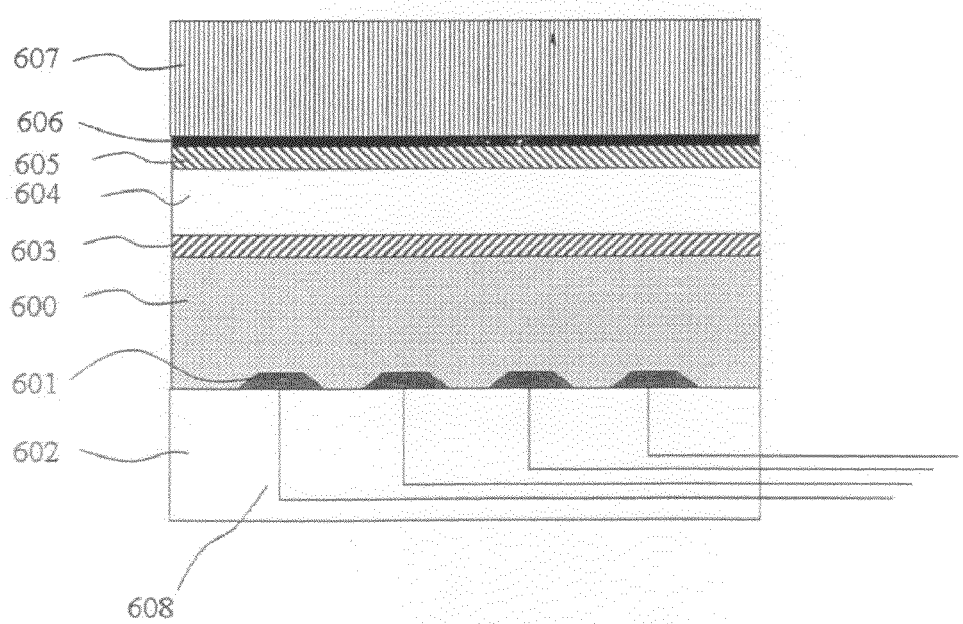
FIG. 7 is a cross-sectional illustration of a gamma ray detector with avalanche gain.

Turning now to FIG. 7, a gamma ray detector with avalanche gain suitable for use in positron emission tomography or single photon computed emission tomography that makes use of the photoconductor device structure of FIG. 1 is shown. As can be seen, the gamma ray detector comprises a thick layer of photoconductive material 604 sandwiched between a cerium dioxide hole blocking contact layer 605 and an antimony trisulfide electron blocking contact layer 603. A transparent indium tin oxide electrode 606 overlies the blocking contact layer 605. An LSO scintillator 607 overlies the electrode 606. A semi-insulating polymer interface layer 600 underlies the blocking contact layer 603. Similar to the previous embodiments, the thick layer of photoconductive material is a layer of a-Se and the semi-insulating polymer interface layer is a layer of cellulose acetate. An array of pixel electrodes 601 is positioned beneath the semi-insulating polymer interface layer 600 and is disposed on a glass substrate or printed circuit board 602. A dedicated transmission line 608 extends from each pixel electrode 601 and leads to coincidence detection electronics. An external circuit similar to that described above with reference to FIGS. 1 and 3 is electrically coupled to the electrode 606 to provide the appropriate bias to the gamma ray detector.

During operation, when the gamma ray detector is biased by an electric field of magnitude sufficient to promote avalanche multiplication and is subjected to incident gamma rays output by an electromagnetic radiation source, the LSO scintillator 607 converts the incident gamma rays into light photons that travel through the transparent indium tin oxide electrode 606 and the cerium dioxide hole blocking contact 605 and are absorbed in the photoconductive material layer 604. Photo-generated holes in the photoconductive material layer undergo avalanche multiplication gain, travel through the electron blocking contact 603 and the semi-insulating polymer interface layer 600 and are collected by pixel electrodes 601. The resulting charges collected by the pixel electrodes 601 are in turn conveyed to the coincidence detection electronics by the dedicated transmission lines 608 and processed to yield a digital image.

As will be appreciated, the above-described devices enable both holes and electrons to avalanche in the photoconductive material layers. The devices can be operated in both the linear and Geiger modes of operation and can provide much higher gains (up to $10^7$) than those that are currently attainable in existing devices. This enables the practical implementation of detectors and imagers with a very wide operating range and which can thus be used in both high light intensity and very low light intensity applications (such as photon counting).

Figure 3:
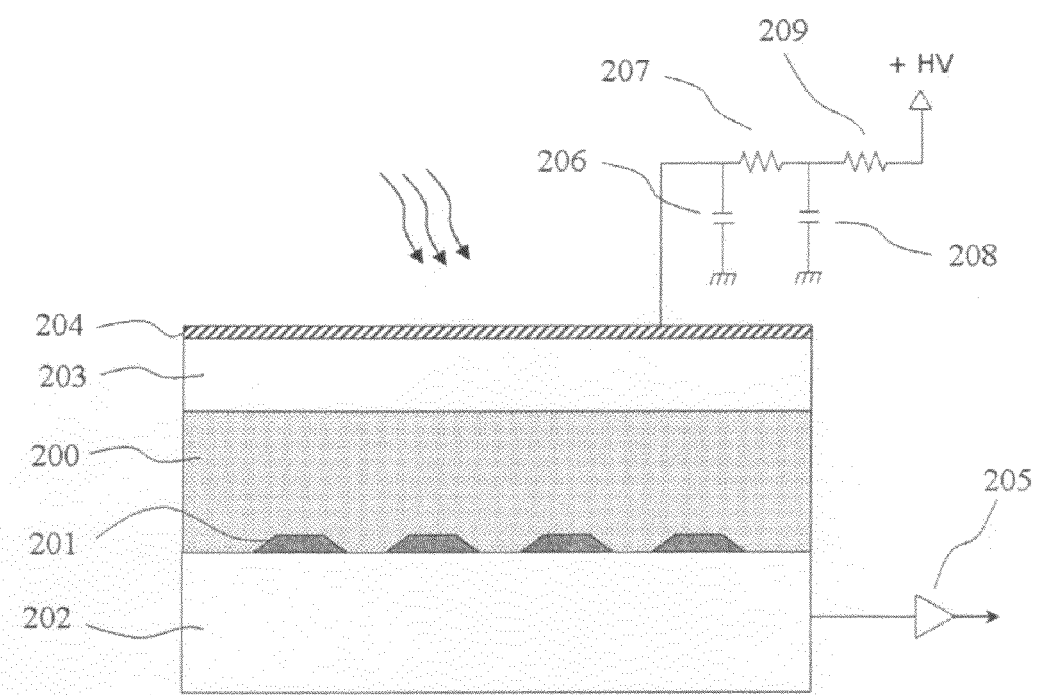
FIG. 3 is a cross-sectional illustration of an imaging device with avalanche gain.
Figure 8:
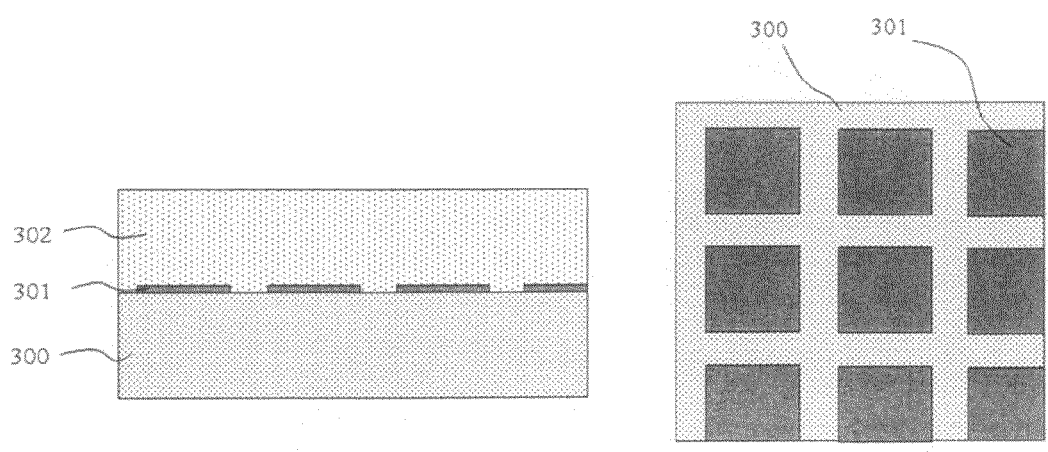
FIG. 8 shows an alternative semi-insulating interface structure for use in the imaging devices of FIGS. 3 and 4 and in the detectors of FIGS. 5 to 7.

Turning now to FIG. 8, an alternative semi-insulating interface structure for use in the imaging devices of FIGS. 3 and 4 and the detectors of FIGS. 5 to 7 is shown. In this embodiment, the semi-insulating interface structure comprises two layers 300 and 302 having different resistivities that are separated by a periodic arrangement of electrically conductive pads 301. The higher resistivity layer inhibits incipient breakdown in the photoconductive material layer and the lower resistivity layer inhibits the avalanche gain from changing throughout the imaging/detector device should a particular region of the photoconductive material layer 203 become conductive. The conductive pads 301 increase the coupling capacitance of the two layer stack.

Polymers that can be used for the semi-insulating interface layers include doped or undoped thermoplastics, (elastomeric or thermosetting types depending on their designated function in a particular detector assembly). Other applicable polymers include but are not limited to benzocyclobutenes, natural and synthetic rubbers, fluoroelastomers, silicones, polyethylene, epoxies, polyurethanes, organosilanes, polyesters, polyethylene co-vinyl acetates, acrylic resins and blends thereof, polyanilines and polythiophenes. Although the semi-insulating interface layers are described as being formed of polymer material, those of skill in the art will appreciate that other suitable materials for the semi-insulating interface layers may be used. For example, inorganic materials having the desired conductive properties can be used. These include doped or undoped ceramics, glasses, crystalline and amorphous semiconductors and in particular alumina, quartz, $Sb_2S_3$, $CeO_2$, $SiO_2$, or other sulfides, selenides, oxides, and nitrides.

Furthermore, it may be desirable to use polymers having specific electrical conduction properties. In particular, when amorphous selenium is used as the photoconductive material, it may be desirable to use hole conducting polymers or polymer nanocomposites. In the embodiment of FIG. 4 for example, the hole conducting polymers or polymer nanocomposites would be placed between the photoconductive material layer 203 and the readout layer 202. Similarly, electron conducting polymers or polymer nanocomposites would be placed between the photoconductive material layer 203 and the transparent conductive electrode 204.

Although the semi-insulating interface layer deposition process described above makes use of spin coating, those of skill in the art will appreciate that other deposition techniques may be employed. For example, the semi-insulating interface layer deposition process may alternatively employ casting, dip coating, printing, doctor blading or roll coating.

Although the transparent conductive electrode is described as being formed of indium tin oxide, those of skill in the art will appreciate that other suitable materials can be used. These include conductive polymers as well as thin metallization layers. If the transparent conductive electrode 204 is adjacent to a semi-insulating interface layer 210 as shown in FIG. 4, a graphitization process can be used to render the top region of the semi-insulating interface layer 210 conductive, thus omitting the need for the transparent conductive electrode 204. During the polymer graphitization process low energy ion implantation of atoms such as xenon or carbon is performed and the ion flux is set above the graphitization threshold of the polymer.

Although embodiments have been described with particular reference to the figures, those of skill in the art will appreciate that variations and combinations may be made without departing from the spirit and scope thereof as defined by the appended claims.

What is claimed is:

1. A photodetector/imaging device comprising:
a layer of photoconductive material converting incident electromagnetic radiation into electrical charge, the layer of photoconductive material being capable of avalanche multiplication when an electric field of sufficient magnitude is applied thereacross;
a readout layer detecting the electrical charge developed by the layer of photoconductive material; and
at least one polymer interface layer between said layer of photoconductive material and said readout layer, said at least one interface layer coupling electrical charge to or from the layer of photoconductive material and inhibiting uncontrolled rises in current in said photoconductive material during avalanche multiplication.

2. The photodetector/imaging device of claim 1 wherein the resistivity of the at least one interface layer is selected so that when a bias voltage is applied to said photodetector/imaging device the bias voltage drops primarily across said photoconductive material.

3. The photodetector/imaging device of claim 2 wherein said at least one interface layer restricts current flow at discharge regions in the layer of photoconductive material that occur during avalanche multiplication.

4. The photodetector/imaging device of claim 3 wherein said at least one interface layer is configured to inhibit diffusion of said at least one interface layer into said layer of photoconductive material.

5. The photodetector/imaging device of claim 4 wherein said at least one interface layer is formed of material having large cross-linked molecular chains that do not diffuse into said layer of photoconductive material.

6. The photodetector/imaging device of claim 3 wherein said at least one interface layer is configured to limit imaging artifacts.

7. The photodetector/imaging device of claim 1 wherein the layer of photoconductive material is an amorphous chalcogenide photoconductor (ACP).

8. The photodetector/imaging device of claim 6 wherein the readout layer comprises an array of thin film transistors coupled to an array of pixel electrodes.

9. The photodetector/imaging device of claim 8 wherein said at least one interface layer is configured to limit the magnitude of electric fields near sharp edges of said pixel electrodes and to planarize the surface of the readout layer adjacent said at least one interface layer.

10. The photodetector/imaging device of claim 1 wherein the readout layer is comprised of a charge coupled device (CCD).

11. The photodetector/imaging device of claim 1 wherein the polymer only conducts holes.

12. The photodetector/imaging device of claim 1 wherein the at least one interface layer comprises first and second interface layers, at least one of said first and second layers being a semi-insulating polymer interface layer.

13. The photodetector/imaging device of claim 12 wherein the first interface layer inhibits uncontrolled rises in current in said layer of photoconductive material during avalanche multiplication and wherein the second interface layer provides a generally planar surface for the readout layer.

14. The photodetector/imaging device of claim 12 wherein one of the interface layers further comprises a stack of layers comprising at least one of resistive layers and patterned conductive layers.

15. The photodetector/imaging device of claim 12 wherein the first interface layer is formed of a hole conducting polymer and the second interface layer is formed of an electron conducting polymer.

16. The photodetector/imaging device of claim 12 wherein said first and second interface layers are on opposite sides of said layer of photoconductive material.

17. A photodetector/imaging device comprising:
an electrode that is generally transparent to incident electromagnetic radiation;
a layer of photoconductive material converting electromagnetic radiation passing through said electrode into electrical charge, the layer of photoconductive material undergoing avalanche multiplication when an electric field of sufficient magnitude is applied thereacross;
a readout layer detecting electrical charge developed in said layer of photoconductive material; and
at least one semi-insulating polymer interface layer between said layer of photoconductive material and said readout layer, said at least one interface layer restricting current flow at discharge regions in the layer of photoconductive material that occur during avalanche multiplication.

18. The photodetector/imaging device of claim 17 wherein the resistivity of the at least one interface layer is selected so that when a bias voltage is applied to said photodetector/imaging device the bias voltage drops primarily across said photoconductive material.

19. The photodetector/imaging device of claim 17 wherein said at least one interface layer is configured to inhibit diffusion of said at least one interface layer into said layer of photoconductive material.

20. The photodetector/imaging device of claim 19 wherein said at least one interface layer is formed of material having large cross-linked molecular chains that do not diffuse into said layer of photoconductive material.

21. The photodetector/imaging device of claim 18 wherein said at least one interface layer is configured to limit imaging artifacts.

22. The photodetector/imaging device of claim 21 wherein the readout layer comprises of an array of thin film transistors coupled to an array of pixel electrodes.

23. The photodetector/imaging device of claim 22 wherein said at least one interface layer is configured to limit the magnitude of electric fields near sharp edges of said pixel electrodes and to planarize the surface of the readout layer adjacent said at least one interface layer.

24. The photodetector/imaging device of claim 17 wherein said layer of photoconductive material is an amorphous chalcognide photoconductor.

25. The photodetector/imaging device of claim 24 wherein the at least one interface layer comprises first and second interface layers, at least one of said first and second layers being made of a semi-insulating polymer.

26. The photodetector/imaging device of claim 25 wherein the first interface layer is formed of a hole conducting polymer and the second interface layer is formed of an electron conducting polymer.

27. A detector/imager comprising:
an electrode generally transparent to incident electromagnetic radiation;
an amorphous chalcogenide photoconductive layer converting electromagnetic radiation passing through said electrode into electrical charge, the photoconductive layer having an avalanche gain that is a function of an electric field applied thereacross;
a readout layer detecting electrical charge developed by said photoconductive layer; and
at least one semi-insulating polymer interface layer between said photoconductive layer and said readout layer, said at least one interface layer being configured to inhibit incipient breakdown in said photoconductive layer.

28. The detector/imager of claim 27 wherein the resistivity of the at least one interface layer is selected so that when a bias voltage is applied to said photodetector/imaging device the bias voltage drops primarily across said photoconductive layer.

29. The detector/imager of claim 27 wherein said at least one interface layer restricts current flow at discharge regions in the photoconductive layer that occur during avalanche multiplication.

30. The detector/imager of claim 29 wherein said at least one interface layer is configured to inhibit diffusion of said at least one interface layer into said photoconductive layer.

31. The detector/imager of claim 30 wherein said at least one interface layer is formed of material having large cross-linked molecular chains that do not diffuse into said photoconductive layer.

32. The detector/imager of claim 30 wherein said at least one interface layer is configured to limit imaging artifacts.

33. The detector/imager of claim 32 wherein the readout layer comprises an array of thin film transistors coupled to an array of pixel electrodes.

34. The detector/imager of claim 33 wherein said at least one interface layer is configured to limit the magnitude of electric fields near sharp edges of said pixel electrodes and to planarize the surface of the readout layer adjacent said at least one interface layer.

35. The detector/imager of claim 27 wherein the photoconductive layer is formed of amorphous selenium (a-Se).

36. The detector/imager of claim 27 further comprising a hole blocking layer between said electrode and said the photoconductive layer and an electron blocking layer between said photoconductive layer and said at least one interface layer.

37. The detector/imager of claim 27 wherein the at least one interface layer comprises first and second interface layers, at least one of said first and second layers being made of a semi-insulating polymer.

38. The detector/imager of claim 37 wherein one of the interface layers further comprises a stack of layers comprising at least one of resistive layers and patterned conductive layers.

39. The detector/imager of claim 37 wherein the first interface layer is formed of a hole conducting polymer and the second interface layer is formed of an electron conducting polymer.

40. The detector/imager of claim 27 further comprising a biasing circuit to apply an electric field across the photoconductive layer.

41. The detector/imager of claim 40 wherein the biasing circuit comprises a signal coupler, a low-pass filter, a current limitor and a signal amplifier.

42. The detector/imager of claim 40 wherein the readout layer comprises a thin film transistor array and wherein said detector/imager further comprising one of a scintillator and phosphor layer optically coupled to said electrode and converting the x-rays.

43. A detector/imager comprising:
an electrode generally transparent to incident electromagnetic radiation;
an amorphous chalcogenide photoconductive layer converting electromagnetic radiation passing through said electrode into electrical charge, the photoconductive layer having an avalanche gain that is a function of an electric field applied thereacross;
a readout layer detecting electrical charge developed by said photoconductive layer; and
at least one semi-insulating interface layer between said photoconductive layer and said readout layer, said at least one interface layer being configured to inhibit incipient breakdown in said photoconductive layer, wherein said at least one interface layer is further configured to inhibit diffusion of said at least one interface layer into said photoconductive layer.

44. The detector/imager of claim 43 wherein the resistivity of the at least one interface layer is selected so that when a bias voltage is applied to said photodetector/imaging device the bias voltage drops primarily across said photoconductive material.

45. The detector/imager of claim 43 wherein said at least one interface layer restricts current flow at discharge regions in the photoconductive layer that occur during avalanche multiplication.

46. The detector/imager of claim 43 wherein said at least one interface layer is formed of material having large cross-linked molecular chains that do not diffuse into said photoconductive layer.

47. The detector/imager of claim 45 wherein said at least one interface layer is configured to limit imaging artifacts.

48. The detector/imager of claim 47 wherein the readout layer comprises an array of thin film transistors coupled to an array of pixel electrodes.

49. The detector/imager of claim 48 wherein said at least one interface layer is configured to limit the magnitude of electric fields near sharp edges of said pixel electrodes and to planarize the surface of the readout layer adjacent said at least one interface layer.

50. The detector/imager of claim 43 wherein the photoconductive layer is formed of amorphous selenium (a-Se).

51. The detector/imager of claim 43 further comprising a hole blocking layer between said electrode and said the photoconductive layer and an electron blocking layer between said photoconductive layer and said at least one interface layer.

52. The detector/imager of claim 43 wherein the at least one interface layer comprises first and second interface layers, at least one of said first and second layers being made of a semi-insulating polymer.

53. The detector/imager of claim 52 wherein one of the interface layers further comprises a stack of layers comprising at least one of resistive layers and patterned conductive layers.

54. The detector/imager of claim 52 wherein the first interface layer is formed of a hole conducting polymer and the second interface layer is formed of an electron conducting polymer.

55. The detector/imager of claim 43 further comprising a biasing circuit to apply an electric field across the photoconductive layer.

56. The detector/imager of claim 55 wherein the biasing circuit comprises a signal coupler, a low-pass filter, a current limitor and a signal amplifier.

57. The detector/imager of claim 55 wherein the readout layer comprises a thin film transistor array and wherein said detector/imager further comprising one of a scintillator and phosphor layer optically coupled to said electrode and converting the x-rays incident on said electrode into optical photons.

58. A photodetector/imaging device comprising:
a layer of photoconductive material converting incident electromagnetic radiation into electrical charge, the layer of photoconductive material being capable of avalanche multiplication when an electric field of sufficient magnitude is applied thereacross;
a readout layer detecting the electrical charge developed by the layer of photoconductive material; and
at least one interface layer between said layer of photoconductive material and said readout layer, said at least one interface layer coupling an electrical charge to or from the layer of photoconductive material and inhibiting uncontrolled rises in current in said photoconductive material during avalanche multiplication, wherein said at least one interface layer is configured to inhibit diffusion of said at least one interface layer into said layer of photoconductive material.

59. The photodetector/imaging device of claim 58 wherein the resistivity of the at least one interface layer is selected so that when a bias voltage is applied to said photodetector/imaging device the bias voltage drops primarily across said photoconductive material.

60. The photodetector/imaging device of claim 59 wherein said at least one interface layer restricts current flow at discharge regions in the layer of photoconductive material that occur during avalanche multiplication.

61. The photodetector/imaging device of claim 58 wherein said at least one interface layer is formed of material having large cross-linked molecular chains that do not diffuse into said layer of photoconductive material.

62. The photodetector/imaging device of claim 60 wherein said at least one interface layer is configured to limit imaging artifacts.

* * * * *